United States Patent [19]

Ericsson

[11] Patent Number: 4,813,352
[45] Date of Patent: Mar. 21, 1989

[54] SILKSCREEN PRINTER

[75] Inventor: Sylve J. D. Ericsson, Tumba, Sweden

[73] Assignee: Svecia Silkscreen Maskiner AB, Norsborg, Sweden

[21] Appl. No.: 108,091

[22] Filed: Oct. 14, 1987

[30] Foreign Application Priority Data

Oct. 15, 1986 [SE] Sweden .................................. 8604378

[51] Int. Cl.4 ...................... B41L 13/02; B41L 41/00; B41F 35/00
[52] U.S. Cl. ..................................... 101/126; 101/425
[58] Field of Search ............... 101/425, 417, 418, 123, 101/126

[56] References Cited

U.S. PATENT DOCUMENTS 4,389,936  6/1983  Jaffa et al. ...................... 101/425 X

FOREIGN PATENT DOCUMENTS 0167269  10/1982  Japan .................................. 101/123

Primary Examiner—Clifford D. Crowder
Attorney, Agent, or Firm—Burns, Doane Swecker & Mathis

[57] ABSTRACT

A silkscreen printer which comprises a printing table which can be moved to a first position (printing position) to support material when a pattern is applied thereto with the aid of a stencil and squeegee. A further table is arranged for horizontal movement from a second position, located to one side of the printer, to a first position which is located in the printer and which corresponds to the printing position of the printing table when the printing table occupies its second position.

10 Claims, 3 Drawing Sheets

SILKSCREEN PRINTER

TECHNICAL FIELD

The present invention relates to silkscreen printers and particularly, although not exclusively, to silkscreen printers of the kind which include a moveable printing table which is arranged for movement between a first material-supporting position in which it supports material while a pattern s printed thereon with the aid of a stencil and a squeegee, and a second position which s remote from said first position.

BACKGROUND PRIOR ART

Several different embodiments of silkscreen printers are known which include reciprocatingly moveable printing tables, in which the table is arranged for movement between a first position in which it supports the material to be printed upon while a pattern is applied thereto by means of the stencil and squeegee, and a second position in which t receives and registers the material in position for printing in the first position of said table.

Such silkscreen printers may be constructed for applying print to printed circuit cards (so-called pattern cards). With this latter application in particular, it is a well known fact that the card must be registered accurately in relation to the stencil, and that when particularly precise transfers are required it may be necessary to compensate for stretching of the stencil caused by contact with the squeegee.

It is also known that when printing on printed circuit cards in particular, the undersurface of the stencil must be kept free from printing ink, paste or varnish.

SUMMARY OF THE INVENTION

Technical Problems

When studying the prior art described above it will be seen that one qualified technical problem resides in providing ways and means which enable the surface of the stencil facing the material to receive print to be kept free from printing ink, printing paste or printing varnish, so as to ensure that a sharp and homogenous print is obtained.

It will also be seen that a further technical problem resides in modifying known silkscreen printers which are already installed, with supplementary devices which will enable the undersurface of the stencil to be kept clean.

In the case of silkscreen printers intended for printing printed circuit cards, another technical problem resides in the provision of means whereby the sharpness and configuration of the pattern printed can be easily checked during a printing process.

Another technical problem encountered with silkscreen printers of this kind resides in the provision of conditions which will enable the use of a further printing table which can support a material capable of absorbing the ink, paste or varnish used and which can be moved to a first position in which it receives a print from the stencil, and subsequently moved to a second position which is remote from the printer and in which the absorbent material can be visually inspected (ocular inspection) to establish the sharpness and configuration of the print.

It will be seen that a further problem in this regard is one of realizing that by using a particular ink-absorbing material in the form of a paper web it is possible to take simple measures to keep the undersurface of the stencil clean over a long series of circuit card printing sequences, by printing the stencil pattern onto the paper web at given intervals between a circuit card printing sequence, for the purpose of cleaning the stencil.

Solution

The aforesaid problems relating to silkscreen printers of the kind which have a moveable printing table which in a first position supports material while print is applied thereto with the aid of a stencil and a squeegee, are resolved by means of the invention with the aid of a further printing table, which can be moved horizontally to a first position corresponding to the first position of the first mentioned table, when said first mentioned table is moved to a second position remote from said first position.

According to one preferred embodiment, the further table is covered either totally or partially with an ink-absorbing material, for instance a paper web which is extended in a loop, from a first reel, across the upper surface of the table, and back along the undersurface of the table to a second reel.

The first reel, the second reel and the further printing table may be carried on a unit which is capable of being moved reciprocatingly between first and second positions.

the invention can be applied to particular advantage in silkscreen printers in which the printing table is reciprocatingly moveable between first and second positions. In accordance with the invention, the further table is moved to its first position and there printed upon in the aforesaid manner, subsequent to the first mentioned printing table having been moved between its first and second positions a pre-determined number of times.

When the further table has been moved to its second position remote from the printer, the print applied to the ink-absorbing material in the first position of said table can be visually examined.

The horizontal movement of the further table is conveniently guided by guide means.

Advantages those advantages primarily associated with a silkscreen printer constructed in accordance with the invention reside in the provision of conditions which will enable the undersurface of the stencil to be kept free from printing ink, printing paste and printing varnish in a simple manner, and thereby ensure that a sharply defined pattern will be obtained on a printed circuit card, so-called pattern card, via visual inspection of the monitoring print on the absorbing material.

The primary characteristic features of a silkscreen printer constructed in accordance with the invention are set forth in the characterizing clause of claim 1.

BRIEF DESCRIPTION OF THE DRAWINGS

An exemplifying embodiment of a silkscreen printer at present preferred and exhibiting the main characteristic features of the invention will now be described in more detail with reference to the accompanying drawings, in which.

DESCRIPTION OF A PREFERRED EMBODIMENT

Figure 1:
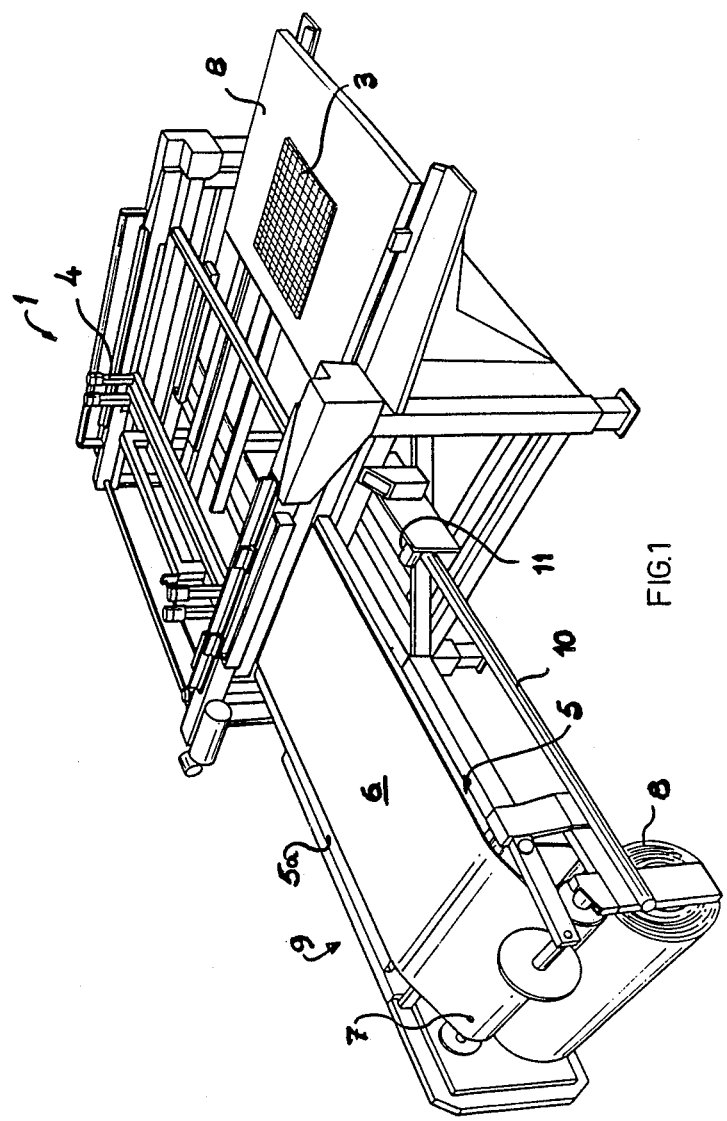
FIG. 1 illustrates a known silkscreen printer complemented with a further printing table in accordance with the invention, and shows the printing table and the further table in their respective second positions.
Figure 2:
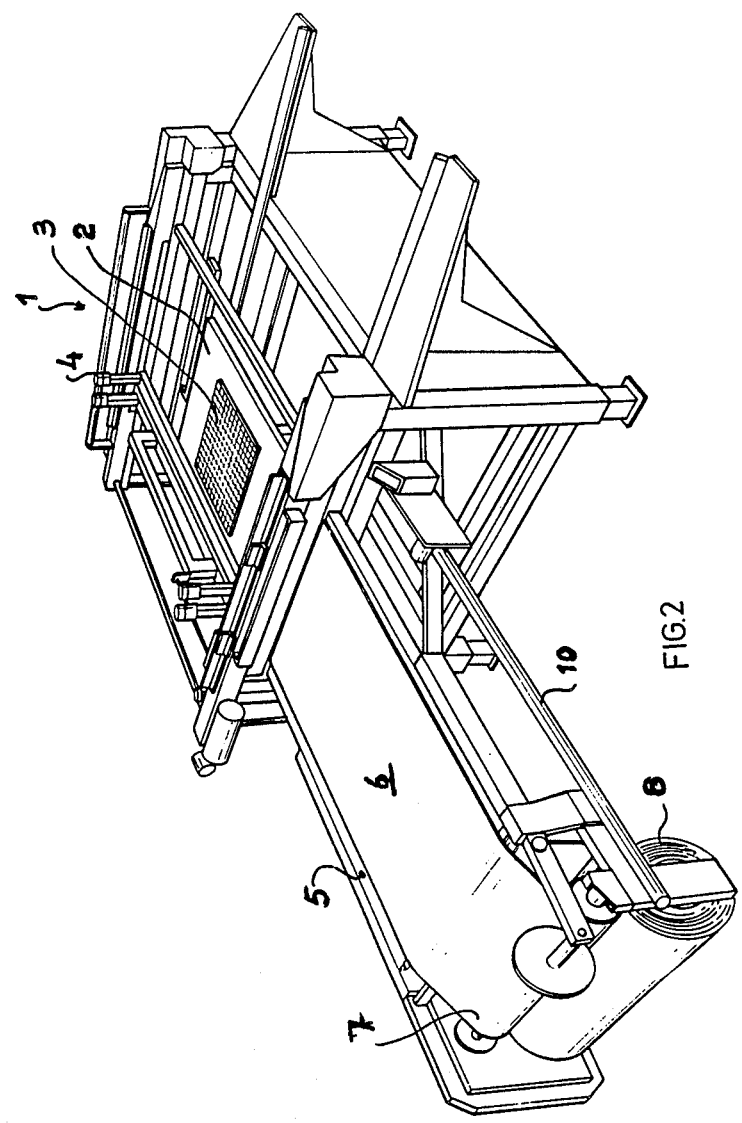
FIG. 2 illustrates the silkscreen printer of FIG. 1 with the printing table in its first, printing position and the further table in its second, inspection position.

FIG. 1 illustrates a silkscreen printer 1 comprising a moveable printing table 2 which s intended to support material 3 in the form of a printed circuit card, a so-called pattern card, in a first or operative printing position (shown in FIG. 2) in which a pattern in applied to the material 3 with the aid of a squeegee, not shown.

Although the actual stencil and squeegee have not been shown in the drawings, part of the arrangement which carries the squeegee has been shown and is referenced 4.

Figure 3:
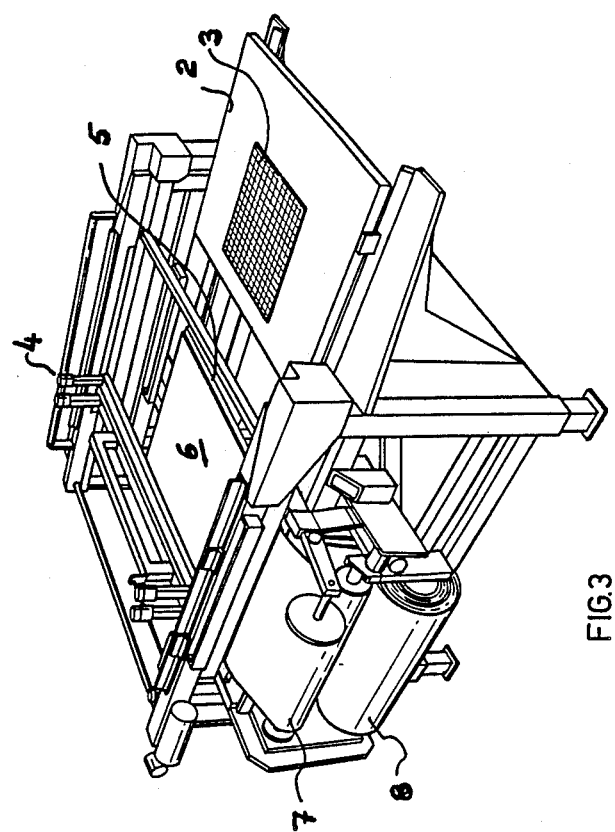
FIG. 3 illustrates the silkscreen printer of FIG. 1 with the printing table in its second position and the further table in its first position.

In accordance with the present invention, the illustrated printer 1 has arranged in co-action therewith a further printing table 5 which is arranged for horizontal movement between a first position illustrated in FIG. 3 and the position illustrated in FIG. 1, this latter position being referred to as the second position of the further table 5 and corresponds to the aforesaid printing position of the printing table 2. The further table 5 is moved to its operative position when the printing table 2 occupies its second position shown in FIG. 1.

The further table 5 is covered either completely or partially with an ink-absorbing material 6.

The ink-absorbing material 6 of this embodiment consists of a paper web which extends in a loop from a first reel 7, across the upper surface 5a of the further table 5 and back to a second reel 8.

The first reel 7, the second reel 8 and the further table 5 are carried by a unit 9 which is arranged for reciprocating movement between a first position, shown in Figure 3, and a second position, shown in FIG. 1.

The unit 9 has provided thereon a guide system 10 which extends through rollers 11 mounted on the printer 1 and which guides the further table 5 in its movements between the aforesaid first and second positions.

Subsequent to having moved the printing table 2 in the printer to its first, printing position (FIG. 2) a predetermined number of times, the further table 5 is moved to its first position (FIG. 3), where the stencil pattern s transferred to the ink-absorbing material 6, with the aid of the squeegee and stencil.

In the process of printing the stencil pattern onto the ink-absorbing material, any ink agglomerations present on the undersurface of the stencil will be removed therefrom and absorbed by the material, therewith cleansing the stencil undersurface and the print on said material can be examined visually when the further table 5 is moved to its second position (FIG. 1), remote from the printer.

A print is taken from the stencil onto the ink-absorbing material, i.e. the paper web, conveniently after each fourth print applied to the pattern card 3 supported on the printing table 2. This printed area of the paper web is wound-on between the reels 7 and 8 through a distance sufficient to bring forward a clean area of the paper web, in readiness for the next cleaned print.

It will be understood that the invention is not restricted to the aforedescribed and illustrated exemplifying embodiment thereof and that said embodiment can be modified within the scope of the inventive concept defined in the following claims.

I claim:

1. A silkscreen printer comprising a printing table movable between a first printing position wherein a pattern s applied to a material with the aid of a stencil and a squeegee and a second, non-printing position located to a first adjacent side of said printer,
   a further table arranged for horizontal reciprocating movement between a second position located to a second adjacent side of the printer, and a first position corresponding to the first printing position of the printing table, said further table being moved to said first position when the printing table occupies said second, non-printing position.

2. A printer according to claim 1 wherein an ink-absorbing material is disposed on the further table.

3. A printer according to claim 2, wherein the ink-absorbing material is a web of paper which extends in a loop from a first reel, across an upper surface of the further table, back along an undersurface of the further table, to a second reel.

4. A printer according to claim 3, wherein the first reel, the second reel, and the further table are disposed on a unit, said unit providing for horizontal reciprocating movement of said further table between said first and said second positions.

5. A printer according to claim 1, wherein the printing table is reciprocated between said first printing position and said second, non-printing position a predetermined number of times before the further table is moved to said first position wherein a print is applied to an ink-absorbing material disposed on said further table.

6. A printer according to claim 5, wherein the print applied to the ink-absorbing material is visually inspectable upon movement of the further table from said first to said second position.

7. A printer according to claim 1, further comprising guide means for guiding the movement of the further table between said first and said second positions.

8. A printer according to claim 2, wherein the printing table is reciprocated between said first printing position and said second, non-printing position a predetermined number of times before first position wherein a print is applied to the ink-absorbing material.

9. A printer according to claim 8, wherein the print applied to the ink-absorbing material is visually inspectable upon movement of the further table from said first to said second position.

10. A printer according to claim 4, further comprising guide means for guiding the movement of the further table between said first and said second positions.

* * * * *